US008203871B2

(12) United States Patent
Lou et al.

(10) Patent No.: US 8,203,871 B2
(45) Date of Patent: *Jun. 19, 2012

(54) RECONFIGURABLE MAGNETIC LOGIC DEVICE USING SPIN TORQUE

(75) Inventors: Xiaohua Lou, Bloomington, MN (US); Dimitar V. Dimitrov, Edina, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/956,487

(22) Filed: Nov. 30, 2010

(65) Prior Publication Data

US 2011/0069536 A1 Mar. 24, 2011

Related U.S. Application Data

(62) Division of application No. 12/126,014, filed on May 23, 2008, now Pat. No. 7,855,911.

(51) Int. Cl.
*G11C 11/00* (2006.01)
*G11C 5/08* (2006.01)
*G11C 11/06* (2006.01)

(52) U.S. Cl. .......... 365/158; 365/66; 365/171; 365/173; 365/209; 365/225.5

(58) Field of Classification Search .............. 365/66, 365/158, 171, 173
See application file for complete search history.

(56) References Cited

U.S. PATENT DOCUMENTS

| 4,733,371 | A | 3/1988 | Terada |
| 5,191,223 | A | 3/1993 | Munekata |
| 5,646,419 | A | 7/1997 | McCaldin |
| 5,673,225 | A | 9/1997 | Jeong |
| 5,761,115 | A | 6/1998 | Kozocki |
| 5,920,446 | A | 7/1999 | Gill |
| 5,982,670 | A | 11/1999 | Yamashita |
| 6,072,718 | A | 6/2000 | Abraham |
| 6,178,136 | B1 | 1/2001 | Lin |
| 6,226,197 | B1 | 5/2001 | Nishimura |

(Continued)

FOREIGN PATENT DOCUMENTS

GB 2 422 735 8/2006

(Continued)

OTHER PUBLICATIONS

K. Miura et al., A novel STRAM with a synthetic ferrigmagnetic free layer . . . , VLSI Symposium on VLSI Tech., Digest of Technical Papers (2007).

(Continued)

*Primary Examiner* — Ly D Pham
(74) *Attorney, Agent, or Firm* — Mueting, Raasch & Gebhardt PA

(57) ABSTRACT

Spin torque magnetic logic devices that function as memory devices and that can be reconfigured or reprogrammed as desired. In some embodiments, the logic device is a single magnetic element, having a pinned layer, a free layer, and a barrier layer therebetween, or in other embodiments, the logic device has two magnetic elements in series. Two input currents can be applied through the element to configure or program the element. In use, logic input data, such as current, is passed through the programmed element, defining the resistance across the element and the resulting logic output. The magnetic logic device can be used for an all-function-in-one magnetic chip.

18 Claims, 3 Drawing Sheets

U.S. PATENT DOCUMENTS

| | | |
|---|---|---|
| 6,252,796 B1 | 6/2001 | Lenssen |
| 6,381,106 B1 | 4/2002 | Pinarbasi |
| 6,469,926 B1 | 10/2002 | Chen |
| 6,532,164 B2 | 3/2003 | Redon |
| 6,542,000 B1 | 4/2003 | Black |
| 6,569,745 B2 | 5/2003 | Hsu |
| 6,584,016 B2 | 6/2003 | Park |
| 6,603,677 B2 | 8/2003 | Wood |
| 6,633,498 B1 | 10/2003 | Engel |
| 6,639,830 B1 | 10/2003 | Heide |
| 6,643,168 B2 | 11/2003 | Okazawa |
| 6,700,753 B2 | 3/2004 | Singleton |
| 6,703,645 B2 | 3/2004 | Ohno |
| 6,711,051 B1 | 3/2004 | Poplevine |
| 6,711,067 B1 | 3/2004 | Kablanian |
| 6,714,444 B2 | 3/2004 | Huai |
| 6,741,492 B2 | 5/2004 | Nii |
| 6,744,086 B2 | 6/2004 | Daughton |
| 6,759,263 B2 | 7/2004 | Ying |
| 6,765,819 B1 | 7/2004 | Bhattacharyya |
| 6,774,391 B1 | 8/2004 | Cowburn |
| 6,781,867 B2 | 8/2004 | Kurth |
| 6,781,871 B2 | 8/2004 | Park |
| 6,801,415 B2 | 10/2004 | Slaughter et al. |
| 6,818,961 B1 | 11/2004 | Rizzo |
| 6,829,161 B2 | 12/2004 | Huai |
| 6,831,312 B2 | 12/2004 | Slaughter |
| 6,834,005 B1 | 12/2004 | Parkin |
| 6,835,423 B2 | 12/2004 | Chen |
| 6,838,740 B2 | 1/2005 | Huai |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,703 B2 | 5/2005 | Princinsky |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,950,335 B2 | 9/2005 | Dieny |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissl |
| 7,161,829 B2 | 1/2007 | Huai |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Panchula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,241,632 B2 | 7/2007 | Yang |
| 7,242,045 B2 | 7/2007 | Nguyen |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,345,912 B2 | 3/2008 | Luo |
| 7,369,427 B2 | 5/2008 | Diao |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,430,135 B2 | 9/2008 | Huai |
| 7,477,491 B2 | 1/2009 | Li |
| 7,480,173 B2 | 1/2009 | Guo |
| 7,485,503 B2 | 2/2009 | Brask |
| 7,486,551 B1 | 2/2009 | Li |
| 7,486,552 B2 | 2/2009 | Apaklov |
| 7,489,541 B2 | 2/2009 | Pakala |
| 7,495,867 B2 | 2/2009 | Sbiaa |
| 7,502,249 B1 | 3/2009 | Ding |
| 7,515,457 B2 | 4/2009 | Chen |
| 7,518,835 B2 | 4/2009 | Huai |
| 7,539,047 B2 | 5/2009 | Katti |
| 7,572,645 B2 | 8/2009 | Sun |
| 7,573,736 B2 | 8/2009 | Wang |
| 7,576,956 B2 | 8/2009 | Huai |
| 7,728,622 B2 | 6/2010 | Fujita |
| 7,852,663 B2 | 12/2010 | Xi |
| 2003/0011945 A1 | 1/2003 | Yuasa |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1 | 3/2005 | Gill |
| 2005/0117391 A1 | 6/2005 | Yoda |
| 2005/0139883 A1 | 6/2005 | Sharma |
| 2005/0150535 A1 | 7/2005 | Samavedam |
| 2005/0150537 A1 | 7/2005 | Ghoshal |
| 2005/0184839 A1 | 8/2005 | Nguyen |
| 2005/0185459 A1 | 8/2005 | Fukuzumi |
| 2005/0237787 A1 | 10/2005 | Huai |
| 2005/0254286 A1 | 11/2005 | Valet |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0141640 A1 | 6/2006 | Huai |
| 2006/0171199 A1 | 8/2006 | Ju |
| 2006/0233017 A1 | 10/2006 | Hosotani |
| 2006/0245117 A1 | 11/2006 | Nowak |
| 2007/0002504 A1 | 1/2007 | Huai et al. |
| 2007/0007609 A1* | 1/2007 | Saito et al. ............... 257/421 |
| 2007/0008661 A1 | 1/2007 | Min |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apakov |
| 2007/0096229 A1 | 5/2007 | Yoshikawa |

| | | | |
|---|---|---|---|
| 2007/0097730 A1 | 5/2007 | Chen | |
| 2007/0120210 A1 | 5/2007 | Yuan | |
| 2007/0132049 A1 | 6/2007 | Stipe | |
| 2007/0164380 A1 | 7/2007 | Min | |
| 2007/0171694 A1 | 7/2007 | Huai | |
| 2007/0230233 A1 | 10/2007 | Takahashi | |
| 2007/0241392 A1 | 10/2007 | Lin | |
| 2007/0246787 A1 | 10/2007 | Wang | |
| 2007/0297220 A1 | 12/2007 | Yoshikawa | |
| 2008/0026253 A1 | 1/2008 | Yuasa | |
| 2008/0061388 A1 | 3/2008 | Diao | |
| 2008/0130354 A1 | 6/2008 | Ho | |
| 2008/0179699 A1 | 7/2008 | Horng | |
| 2008/0180991 A1 | 7/2008 | Wang | |
| 2008/0191251 A1 | 8/2008 | Ranjan | |
| 2008/0258247 A1* | 10/2008 | Mancoff et al. | 257/421 |
| 2008/0265347 A1 | 10/2008 | Iwayama | |
| 2008/0273380 A1 | 11/2008 | Diao | |
| 2008/0277703 A1 | 11/2008 | Iwayama | |
| 2008/0291721 A1 | 11/2008 | Apalkov | |
| 2008/0310213 A1 | 12/2008 | Hing | |
| 2008/0310219 A1 | 12/2008 | Chen | |
| 2009/0027810 A1 | 1/2009 | Horng | |
| 2009/0040855 A1 | 2/2009 | Luo | |
| 2009/0050991 A1 | 2/2009 | Nagai | |
| 2009/0073756 A1 | 3/2009 | Yang | |
| 2009/0185410 A1 | 7/2009 | Huai | |
| 2009/0218645 A1* | 9/2009 | Ranjan et al. | 257/421 |
| 2009/0257154 A1 | 10/2009 | Carey | |
| 2009/0296454 A1 | 12/2009 | Honda | |
| 2009/0302403 A1 | 12/2009 | Nguyen | |
| 2010/0034009 A1 | 2/2010 | Lu | |
| 2010/0118600 A1* | 5/2010 | Nagase et al. | 365/158 |
| 2010/0176471 A1 | 7/2010 | Zhu | |

FOREIGN PATENT DOCUMENTS

WO WO 2008/100868 8/2008

OTHER PUBLICATIONS

A. Ney et al, Programmable Computing with a Single Magnetoresistive Element, Nature 425, 485 (2003).
L. Berger, Emission of Spin Waves bya Magnetic Multilayer Traversed by a Current, Phys. Rev. B 54, 9353 (1996).
W.C. Black, Jr., et al., Programmable Logic Using Giant-Magnetoresistance and Spin-Dependent Tunneling Devices (invited), J. Appl. Phys. 87, 6674 (2000).
H. Meng et al., A Spintronics Full Adder for Magnetic CPU, IEEE Elec. Dev. Lett. 26, 360 92005).
R.P. Cowburn et al., Room Temperature Magnetic Quantum Cellular Automata. Science 287, 1466 (2000).
U.S. Appl. No. 12/125,975, filed May 23, 2008, Inventor: Haiwen Xi, Our Ref: 13866.00.
Baek et al., Tech. Dig. IEDM (2004) 587.
Chu et al., Fabrication of Ideally Ordered Nanoporous Alumina Films and Integrated Alumina Nanotubule Arrays by High-Field Anodization, Adv. Mater. 2005, 17, 2115-2119.
de Groot et al., New Class of Materials: Half-Metallic Ferromagnets, Physics Review Letters, 50, 2024 (1983).
Egelhoff et al., Oxygen as a Surfactant in the Growth of Giant Magnetoresistance Spin Valves, Journal of Applied Physics 82 (12), Dec. 15 1997.
Emley, N.C., et al., Reduction of Spin Transfer by Synthetic Antiferromagnets, Applied Physics Letters, May 24, 2004, pp. 4257-4259, vol. 84, No. 21.
Folk et al., A Gate-Controlled Bidirectional Spin Filter Using Quantum Coherence, Science, vol. 299, Jan. 31, 2003, pp. 679-682.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-1060.
Huczko, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.
Korenivski, et al., Thermally Activiated Switching in Spin-Flop Tunnel Junctions, Applied Physics Letters 86, 252506 (2005).
Li et al., Role of Oxygen Exposure in Different Positions in the Synthetic Spin Valves, Journal of Applied Physics, vol. 93, No. 10, May 15, 2003.
Macak et al., High-Aspect-Ratio TiO2, Nanotubes by Anodization of Titanium, Angew. Chem. Int. Ed. 2005, 44, 2100-2102.
Masuda and Kenji Fukuda, Science, 268, 1466 91995).
Masuda et al., Ordered Metal Nanohole Arrays Made by a Two-Step Replication of Honeycomb Structures of Anodic Alumina, Science, OI. 268, Jun. 9, 1995.
Meng et al., Spin Transfer in Nanomagnetic Devices with Perpendicular Anistropy, Applied Physics Letters 88, 172506 (2006).
PCT Search Report and Written Opinion dated Oct. 4, 2010, Our Ref: 15010WO00.
PCT Search Report and Written Opinion dated Mar. 10, 2010, Our Ref: 13835WO00.
PCT Search Report and Written Opinion dated Mar. 22, 2010, Our Ref: 14647WO00.
Prejbeanu et al., Thermally Assisted MRAM, J. Phys. Condens. Matter 19 (2007) 165218 (23 pp).
Seki et al., Spin-Polarized Current-Induced Magnetization Reversal in Perpendicularly Magnetized L1O-FePt Layers, Applied Physics Letters 88, 172504 (2006).
Sharrock, Time Dependence of Switching Fields in Magnetic Recording Media (Invited), J. Appl. Phys. 76 (10), Nov. 15, 1994.
Slonczewski et al., Current-Driven Excitation of Magnetic Multilayers, Journal of Magnetism and Magnetic Materials 159 (1996) L1-L7.
Sun, "Spin-Current Interaction with a Monodomain Magnetic Body: A Model Study", Physical Review B, vol. 62, No. 1, (2000), pp. 570-578.
Sun, Current-Driven Magnetic Switching in Manganite Trilayer Junctions, Journal of Magnetism and Magnetic Materials 202 (1999) 157-162.
Thurn-Albrecht et al., Science, 290, 2126 (2000).
U.S. Appl. No. 12/416,976, filed Apr. 2, 2009, Inventor: Zheng, Our Ref: 14630.
U.S. Appl. No. 12/106,382, filed Apr. 21, 2008, Inventors: Xi et al.
U.S. Appl. No. 12/126,014, filed May 23, 2008, Inventor: Xiaohua Lou, Our Ref: 14204.00.
U.S. Appl. No. 12/170,519, filed Jul. 10, 2008, Inventors: Xi et al.
U.S. Appl. No. 12/175,545, filed Jul. 18, 2008, Inventor: Lou.
U.S. Appl. No. 12/239,882, filed Sep. 29, 2008, Inventor: Zheng et al.
U.S. Appl. No. 12/239,887, filed Sep. 29, 2008; Inventor: Zheng, Our Ref: 1011.14596.00.
U.S. Appl. No. 12/258,476, filed Oct. 27, 2008, Inventor: Lou.
U.S. Appl. No. 12/258,491, filed Oct. 27, 2008, Inventor: Lou.
U.S. Appl. No. 12/258,492, filed Oct. 27, 2008, Inventor: Lou.
U.S. Appl. No. 12/269,507, filed Nov. 12, 2008, Inventor: Tian.
U.S. Appl. No. 12/269,514, filed Nov. 12, 2008, Inventor: Venkatasamy.
U.S. Appl. No. 12/269,537, filed Nov. 12, 2008, Inventor: Tang et al.
U.S. Appl. No. 12/396,905, filed Mar. 3, 2009, Inventor: Gao, Our Ref: 14689.
U.S. Appl. No. 12/398,214, filed Mar. 5, 2009, Inventor: Wang et al.
U.S. Appl. No. 12/425,457, filed Apr. 17, 2009, Inventor: Gao (14787).
Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).
Wendt et al., Electronic and Vibrational Properties of Ultrathin SiO2 Films Grown on Mo(112), 2005, Phys. Rev. vol. B72, pp. 1150409-1-115409.0.
Yan et al., Magnesium Oxide as a Candidate High-k Gate Dielectric, 2006, Applied Physics Lett. vol. 88, pp. 142901-1-142901-3.
Yen et al., Reduction in Critical Current Density for Spin Torque Transfer Switching with Composite Free Layer, Applied Physics Letters 93, 092504 (2008).
Zheng et al., Low Switching Current Flux-Closed Magnetoresistive Random Access Memory, Journal of Applied Physics, May 15, 2003.
Zheng et al., Magnetic Random Access Memory (MRAM), Journal of Nanoscience and Nanotechnology, vol. 7, 117-137 (2007).
Zhuang et al., Tech Dig. IEDM (2002) 193.

* cited by examiner

RECONFIGURABLE MAGNETIC LOGIC DEVICE USING SPIN TORQUE

PRIORITY

This application is a divisional application of pending U.S. patent application Ser. No. 12/126,014, filed on May 23, 2008 entitled "Reconfigurable Magnetic Logic Device Using Spin Torque", the disclosure of which is incorporated herein by reference.

BACKGROUND

This application relates to spin torque transfer devices.

Spin electronics has attracted much research and industrial interest in the last decade. In spin electronics, the spin of an electron, rather than the charge, is used to indicate the presence of digital information. The digital information or data, represented as a "0" or "1", is storable in the alignment of magnetic moments within a magnetic element and is represented as the resistive state of the magnetic element, which depends on the magnetic moment's alignment or orientation. The stored information or data is read from the element by detecting the magnetic element's resistive state. A more recent development of spin electronics is the spin transfer torque technology, which is a method to manipulate the electron spin and magnetic orientation of electronic devices and therefore the stored information.

The magnetic element, in general, includes a ferromagnetic pinned layer and a ferromagnetic free layer, each having a magnetization orientation, and a non-magnetic barrier layer therebetween. The magnetization orientations of the free layer and the pinned layer define the resistance of the overall magnetic element. Such an element is generally referred to as a "spin tunneling junction," "magnetic tunnel junction" or the like. When the magnetization orientations of the free layer and pinned layer are parallel, the resistance of the element is low. When the magnetization orientations of the free layer and the pinned layer are antiparallel, the resistance of the element is high.

The magnetization orientation of the free layer is conventionally controlled by an external magnetic field. Recently-observed spin transfer torque effect shows that a DC current or current pulse through the magnetic element can also be used to manipulate the free layer magnetization orientation. Under a sufficiently large current, the free layer magnetization orientation stabilizes along the parallel direction with respect to the pinned layer magnetization orientation when electrons flow from the pinned layer to the free layer, vice versa. To read out the resistance of the magnetic element, a current-perpendicular-to-plane (CPP) configuration is used, in which a small current is driven perpendicular to the layers of the magnetic element. Because of the small size of the magnetic elements and the close spacing of adjacent elements, care must be taken that current applied to one magnetic element does not inadvertently affect an adjacent magnetic element.

At least because of their small size, it is desirous to use magnetic logic elements in many applications. It has been proposed that these spin electronic devices using magnetic fields could be used as logic devices. However, there are deficiencies in the proposed designs. Complex logic functions (such as an XOR function) can not be realized using the design of magnetic logic devices employing magnetic fields.

The present disclosure provides improved programmable or reconfigurable magnetic logic device that utilize input current passed through magnetic elements.

BRIEF SUMMARY

The present disclosure relates to spin torque magnetic logic devices. In some embodiments, the logic device is a single magnetic element, having a pinned layer, a free layer, and a barrier layer therebetween. Two input currents can be applied through the element to configure or program the element. In use, logic input current is passed through the programmed element, defining the resistance across the element and the resulting logic output. The logic devices also function as memory devices and may be reprogrammed when desired without requiring hardware changes.

A first particular embodiment of this disclosure is a magnetic logic device having a magnetic tunnel junction element comprising a pinned layer, a free layer and a barrier layer therebetween, the free layer magnetization orientation switchable by spin torque. Through the magnetic tunnel junction element is an electrical path for a first logic input current and a second logic input current. A resistance sensing circuit is electrically connected to the magnetic tunnel junction element to detect the resistance (logic output) across the element. In some embodiments, the logic device is an AND gate. In other embodiments, the logic device is an OR gate.

A second particular embodiment of this disclosure is a magnetic logic device having a first magnetic tunnel junction element comprising a ferromagnetic pinned layer, a ferromagnetic free layer, and a non-magnetic barrier layer therebetween, and a second magnetic tunnel junction element connected in series to the first magnetic tunnel junction element with a spacer layer therebetween, the second element comprising a second ferromagnetic pinned layer, a second ferromagnetic free layer, and a second non-magnetic barrier layer therebetween. The free layers have a magnetization orientation switchable by spin torque. The device includes a first input current path and a second input current path into and through the first and second magnetic tunnel junction elements that provide a flow of electrons through the first magnetic tunnel junction element and the second magnetic tunnel junction element. Also included is a resistance sensing circuit electrically connected to the first magnetic tunnel junction element and the second magnetic tunnel junction element. This magnetic logic device is suitable for complex logic functions. In some embodiments, the magnetic logic device is a NAND gate, having the first free layer antiparallel to the first pinned layer, the second free layer antiparallel to the second pinned layer, and the first pinned layer parallel to the second pinned layer. In other embodiments, the magnetic logic device is an XOR gate, having the first free layer antiparallel to the first pinned layer, the second free layer parallel to the second pinned layer, and the first pinned layer parallel to the second pinned layer.

A third particular embodiment of this disclosure is a magnetic logic device comprising a first magnetic logic element and a second magnetic logic element, and a non-magnetic spacer layer therebetween, each magnetic logic element comprising a ferromagnetic pinned layer, a ferromagnetic free layer and a non-magnetic barrier layer therebetween, each of the free layers having a magnetization orientation. Also present is an input system that defines the magnetization orientations of the free layers in accordance with a combination of a first input data and a second input data, and an output sensing system that reads an output data. The input data may be current, such as DC current. The output data may be resistance.

A fourth particular embodiment of this disclosure is a method for programming a magnetic logic device by providing a magnetic logic device having first and second magnetic logic elements, orienting the magnetization orientation of the free layers of the elements by passing a first input current and a second input current through the magnetic logic device to form a programmed logic device, and reading the output data and, based on the input currents, to determine a logic function of the device. The reading of the output data may be with a current less than a critical current of the free layers. In some embodiments, orienting the magnetization orientation of the free layers is done by passing a first input current and a second input current through the magnetic logic device so that the pinned layer and the free layer of the first magnetic logic element are antiparallel and the pinned layer and the free layer of the second magnetic logic element are antiparallel, to form a NAND logic device. In some other embodiments, the orienting of the magnetization orientation of the free layers is done by passing a first input current and a second input current through the magnetic logic device so that the pinned layer and the free layer of the first magnetic logic element are antiparallel and the pinned layer and the free layer of the second magnetic logic element are parallel, to form an XOR logic device. In some embodiments, after reading the output data, a reprogrammed logic device can be made by reorienting the magnetization orientation of the free layers by passing a third input current and a fourth input current through the magnetic logic device.

These and various other features and advantages will be apparent from the following detailed description.

BRIEF DESCRIPTION OF THE DRAWINGS

The invention may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. While the present invention is not so limited, an appreciation of various aspects of the invention will be gained through a discussion of the examples provided below.

All scientific and technical terms used herein have meanings commonly used in the art unless otherwise specified. The definitions provided herein are to facilitate understanding of certain terms used frequently herein and are not meant to limit the scope of the present disclosure.

Figure 1:
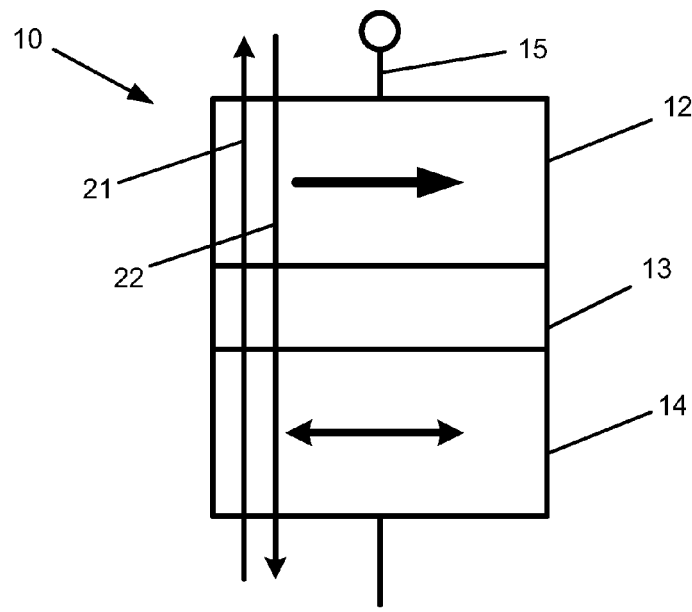
FIG. 1 is a schematic diagram of a first embodiment of a logic device according to the present disclosure.

Referring to FIG. 1, an embodiment of a magnetic logic device 10 is diagrammatically illustrated. Although not illustrated herein, logic device 10 is formed on a substrate. Logic device 10 includes a ferromagnetic pinned layer 12, a ferromagnetic free layer 14, and a non-magnetic tunnel barrier layer 13 between pinned layer 12 and free layer 14. Each of pinned layer 12 and free layer 14 has a magnetic orientation or magnetization orientation associated therewith, indicated by the arrow orientation; in FIG. 1, pinned layer 12 has a designated magnetization orientation, whereas free layer 14 is illustrated as having a non-designated magnetization orientation. Pinned layer 12 may be pinned by an antiferromagnetic layer or may be a fixed layer without pinning but with a high coercivity to stabilize itself. Pinned layer 12 could be replaced by a synthetic antiferromagnetic (SAF) coupled structure, i.e., two ferromagnetic sublayers separated by a metallic spacer, such as Ru or Cu, with the magnetization orientations of the sublayers in opposite directions. Tunnel barrier layer 13 may be a non-magnetic metallic material or a non-magnetic metal oxide material. Note that other layers, such as seed or capping layers, or electrodes adjacent layers 12, 14, are not depicted for clarity, as are bit lines and word lines.

Logic device 10 is configured to receive input via a first electric current 21 and a second electric current 22 passing therethrough. In this embodiment, for this discussion, programming or input current flowing through device 10 in a downward direction (as current 22 is illustrated), has electrons flowing upward, and is defined as binary data bit "0"; programming current flowing through device 10 in an upward direction (as current 21 is illustrated) has electrons flowing downward, and is defined as binary data bit "1". It should be understood that current 21, 22 passes through device 10 for a very short time, and that current 21, 22 could be referred to as a current pulse or even a voltage pulse. Further, the direction of currents 21, 22 is illustrated in FIG. 1 merely as an example of orientation, and is not intended to define the magnetization orientation of free layer 14.

Figure 1A:
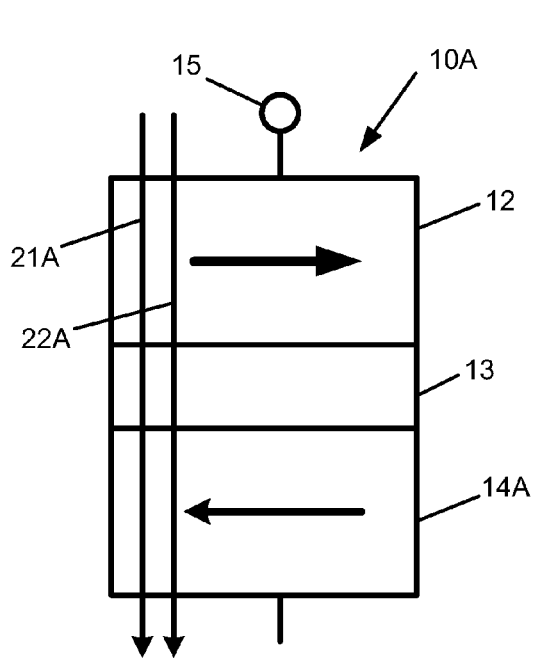
FIGS. 1A and 1B are schematic diagrams of the logic device of FIG. 1, having been programmed.
Figure 1B:
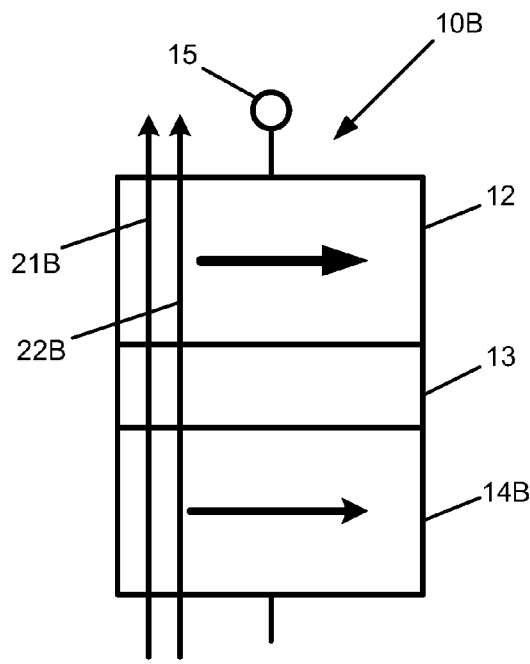

FIGS. 1A and 1B illustrate the programming of logic device 10 by defining the magnetization orientation of free layer 14 by currents 21, 22 applied to device 10. In FIG. 1A, both currents 21A, 22A pass down through logic device 10A; the total input current is "00". Due to both currents 21A, 22A passing in the direction of pinned layer 12 to free layer 14A, the resulting magnetization orientation of free layer 14A is antiparallel to the orientation of pinned layer 12. These initial currents 21A, 22A program device 10A as an AND gate, as will be described below. FIG. 1B, both currents 21B, 22B pass up through logic device 10B; the total input current is "11". Due to both currents 21B, 22B passing in the direction of free layer 14 to pinned layer 12, the resulting magnetization orientation of free layer 14B is parallel to the orientation of pinned layer 12. These initial currents 21B, 22B program device 10B as an OR gate, as will be described below.

After being programmed, logic input currents can be applied to logic devices 10A, 10B to obtain a logic output. For both programmed devices 10A, 10B, logic input current 21A, 21B and logic input current 22A, 22B should be applied simultaneously (i.e., logic input 21A and logic input 22A are applied simultaneous to produce device 10A, and logic input 21B and logic input 22B are applied simultaneous to produce device 10B). If not applied simultaneously, the prior programmed state of device 10A, 10B may be altered. To better avoid undesired altering of the programmed states, the amplitude of each of the input currents can be maintained below the critical current level (i.e., the current needed to switch the free layer), so that only the combination of the two input currents can switch the free layer.

Based on the logic input currents into programmed device 10A, 10B, the logic output is defined by the resistance across device 10A, 10B. Since magnetic tunneling of electrons through tunnel barrier layer 13 contributes the majority of the resistance across magnetic element 10A, 10B, the resistance of element 10A, 10B is determined, in large part, by the magnetization orientation of pinned layer 12 and free layer 14A, 14B. A resistance sensing circuit 15 is operably coupled across device 10A, 10B to measure the resistance. Because pinned layer 12 has its magnetization orientation fixed, change in the magnetization orientation of free layer 14A, 14B will change the resistance and the logic output of device 10A, 10B. It is well established that when the magnetization orientations of the free layer and pinned layer are parallel, the output resistance across the element is low ($R_L$); for this discussion, the low resistance is defined as output binary data bit "1". When the magnetization orientations of the free layer and the pinned layer are antiparallel, the output resistance of the element is high ($R_H$); for this discussion, the high resistance is defined as output binary data bit "0".

As mentioned above, programmed device 10A is an AND gate. In use, two bits of data, as input current using the definitions of above, are applied to programmed device 10A. The input levels and output for the four possible configurations are summarized below in Table 1. The four configurations of inputs and output define the logic device as an AND gate.

TABLE 1

| Input Data 21A | Input Data 22A | Free Layer 14A | Output Data |
| --- | --- | --- | --- |
| 0 | 0 | No switch | 0 |
| 0 | 1 | No switch | 0 |
| 1 | 0 | No switch | 0 |
| 1 | 1 | Switch | 1 |

As mentioned above, programmed device 10B is an OR gate. In use, two bits of data, as input current using the definitions of above, are applied to programmed device 10B. The input levels and output for the four possible configurations are summarized below in Table 2. The four configurations of inputs and output define the logic device as an OR gate.

TABLE 2

| Input Data 21B | Input Data 22B | Free Layer 14B | Output Data |
| --- | --- | --- | --- |
| 0 | 0 | Switch | 0 |
| 0 | 1 | No switch | 1 |
| 1 | 0 | No switch | 1 |
| 1 | 1 | No switch | 1 |

Either or both programmed devices 10A, 10B can be reprogrammed or reconfigured at a later time by applying current inputs to obtain the desired configuration. One method to reprogram devices 10A, 10B is to apply an input current above the critical current level (i.e., the current needed to switch free layer 14A, 14B).

Figure 2:
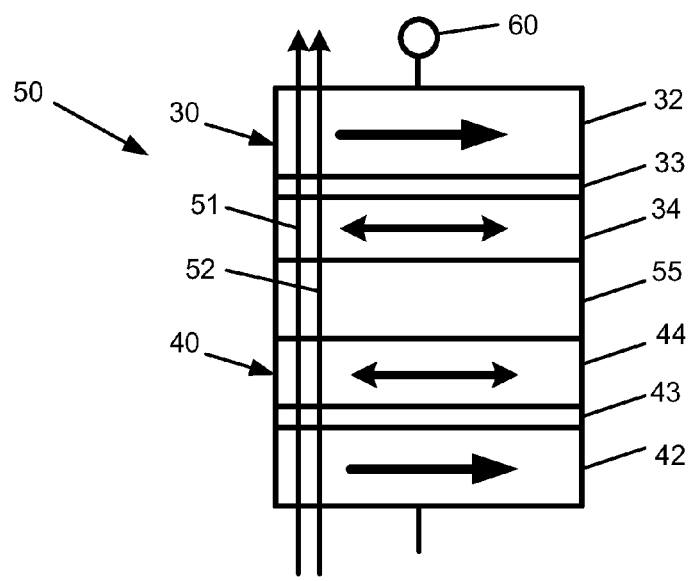
FIG. 2 is a schematic diagram of a second embodiment of a logic device according to the present disclosure.

Another embodiment of a magnetic logic device in accordance with this disclosure is illustrated in FIG. 2. Logic device 10, discussed above, is composed of a single magnetic logic element (having a pinned layer, a free layer and a tunnel barrier layer) through which two currents are passed. Logic device 50 of FIG. 2 is composed of two magnetic logic elements in series.

Logic device 50 is composed of a first magnetic element 30 and a second magnetic element 40. A resistance sensing circuit 60 is operably coupled across device 50 to measure the resistance. First element 30 includes a ferromagnetic pinned layer 32, a ferromagnetic free layer 34, and a non-magnetic tunnel barrier layer 33 between pinned layer 32 and free layer 34. Similarly, second element 40 includes a ferromagnetic pinned layer 42, a ferromagnetic free layer 44, and a non-magnetic tunnel barrier layer 43 between pinned layer 42 and free layer 44. Positioned between first element 30 and second element 40, specifically between free layer 34 and free layer 44, is a spacer layer 55.

Each of pinned layers 32, 42 and free layers 34, 44 has a magnetic orientation or magnetization orientation associated therewith. In FIG. 2, pinned layers 32, 42 both have a designated magnetization orientation, whereas free layers 34, 44 are illustrated as having a non-designated magnetization orientation. Tunnel barrier layers 33, 43 may be non-magnetic metallic material or non-magnetic metal oxide material. Spacer layer 55 can be a non-magnetic, metallic layer (e.g., Cu) and is sufficiently thick to isolate elements 30, 40 so that first element 30 and second element 40 function independently of one another. That is, the magnetization orientation of free layer 34 does not affect and is not affected by the magnetization orientation of free layer 44. Note that other layers, such as seed or capping layers, or electrodes adjacent layers 32, 42, are not depicted for clarity.

In this embodiment, logic device 50 is configured to receive a first programming current 51 and a second programming current 52 passing therethrough. In this embodiment, both currents 51, 52 flow upward, so that the electrons flow downward. In this discussion, when a current (either current 51, 52) is "off", the input is defined as binary data bit "0", and current "on" is input defined as binary data bit "1". The "on" status of currents 51, 52 in FIG. 2 is merely as an example, and is not intended to define the magnetization orientation of free layers 34, 44.

For discussion herein, the coercive fields of free layers 34, 44 are different, resulting in a difference in the critical switching current for elements 30, 40. A hard free layer (e.g., free layer 34) has a higher switching current ($I_H$) than a soft free layer (e.g., free layer 44), which has a smaller switching current ($I_S$). The amplitude of each of programming currents 51, 52 ($I_{input}$) satisfies $\text{Max}\{I_S, \frac{1}{2} I_H\} < I_{input} < I_H$ where $\text{Max}\{I_S, \frac{1}{2} I_H\}$ is the larger of $I_S$ and $\frac{1}{2} I_H$. In this manner, a single input current can only switch the soft free layer, and the sum of two input currents is needed to switch the hard free layer.

As described above in reference to logic device 10, when the magnetization orientations of the free layer and pinned layer are parallel, the output resistance across the element is low ($R_L$); for this discussion, the low resistance is defined as "0". When the magnetization orientations of the free layer and the pinned layer are antiparallel, the output resistance of the element is high ($R_H$); for this discussion, the high resistance is defined as "1".

Returning to the figures, FIGS. 2A through 2D illustrate the programming of logic device 50 of FIG. 2 by defining the magnetization orientation of free layers 34, 44 due to input currents 51, 52 applied to device 50. The various elements and layers of device 50 are not illustrated in FIGS. 2A through 2D, but are understood to be as those illustrated in FIG. 2.

Figure 2A:
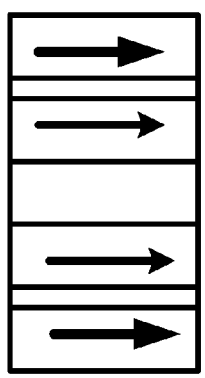
FIGS. 2A through 2D are representations of various magnetization orientations of the logic device of FIG. 2.
Figure 2B:
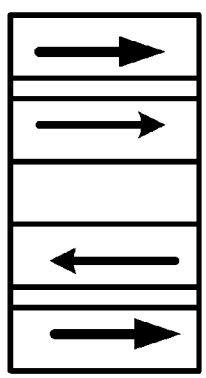
Figure 2C:
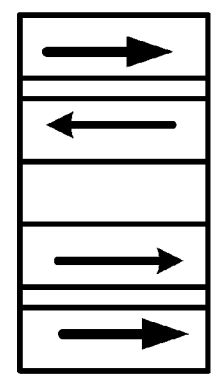
Figure 2D:
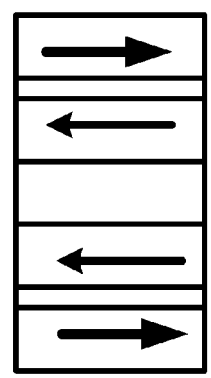

In FIG. 2A, element 30 has parallel magnetization orientations, which is $R_L$, and element 40 has parallel magnetization orientations, $R_L$. In FIG. 2B, element 30 has parallel magnetization orientations, which is $R_L$, and element 40 has antiparallel magnetization orientations, $R_H$. In FIG. 2C, element 30 has antiparallel magnetization orientations, which is $R_H$, and element 40 has parallel magnetization orientations, $R_L$. In FIG. 2D, element 30 has antiparallel magnetization orientations, which is $R_H$, and element 40 has antiparallel magnetization orientations, $R_H$. The resistance of FIG. 2A is the lowest and the resistance of FIG. 2D is the highest. For this discussion, the lowest and middle resistance levels (FIGS. 2A, 2B, and 2C) are defined as "0" and the highest resistance level (FIG. 2D) is defined as "1".

Figure 3:
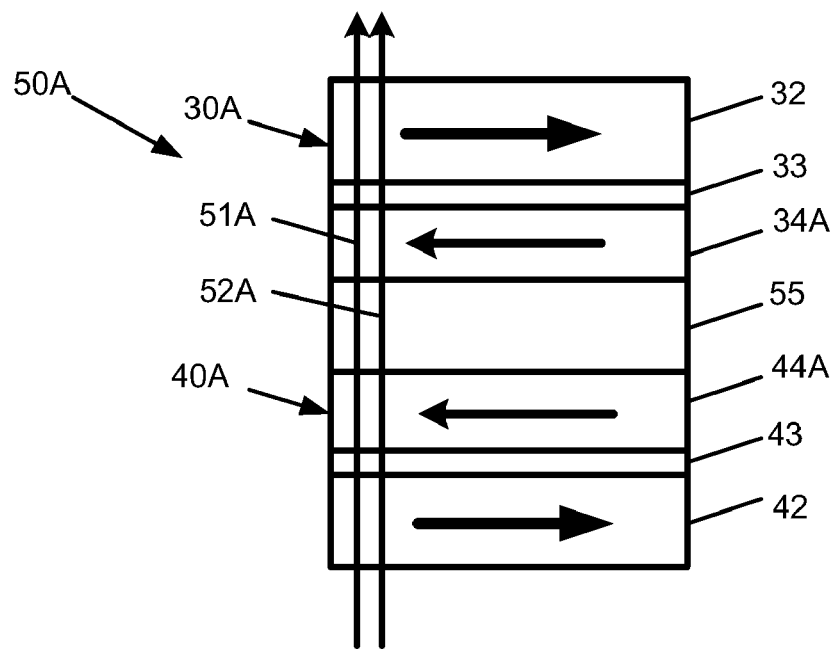
FIG. 3 is a schematic diagram of a third embodiment of a logic device according to the present disclosure, in particular, a NAND gate.

FIG. 3 illustrates device 50 programmed as device 50A, at the highest resistance level (FIG. 2D). In use, two bits of data, as input current using the definitions of above, can be applied to device 50A. The input levels and output for the four possible configurations are summarized below in Table 3. These four configurations of inputs and output define logic device 50A as a NAND gate.

TABLE 3

| Input Data 51A | Input Data 52A | Free Layers | Output Data |
| --- | --- | --- | --- |
| 0 | 0 | No switch | 1 |
| 0 | 1 | No switch | 1 |
| 1 | 0 | No switch | 1 |
| 1 | 1 | Switch hard layer 34A | 0 |

When both inputs are "0" (i.e., no input current applied), no free layers switch their magnetization orientation, and device 50A remains as it is. When the input is "01" or "10", sufficient input current is applied to switch soft layer 44A of element 40A, but not hard layer 34A. However, because of the direction of input of input currents 51, 52 through element 40A, first through pinned layer 42 and then through free layer 44A, the desired orientation is antiparallel. Thus, free layer 44A does not switch from its programmed magnetization orientation. When the input "11" is applied, sufficient input current is applied to switch hard free layer 34A of element 30 and soft free layer 44A of element 40A. Because the direction of current input into element 30A is first through free layer 34A then to pinned layer 32, free layer 34A desires parallel orientation, and hard free layer 34A switches. However, because of the direction of current input through element 40A, the desired orientation is antiparallel. Thus, soft free layer 44A does not switch from its programmed magnetization orientation.

Figure 4:
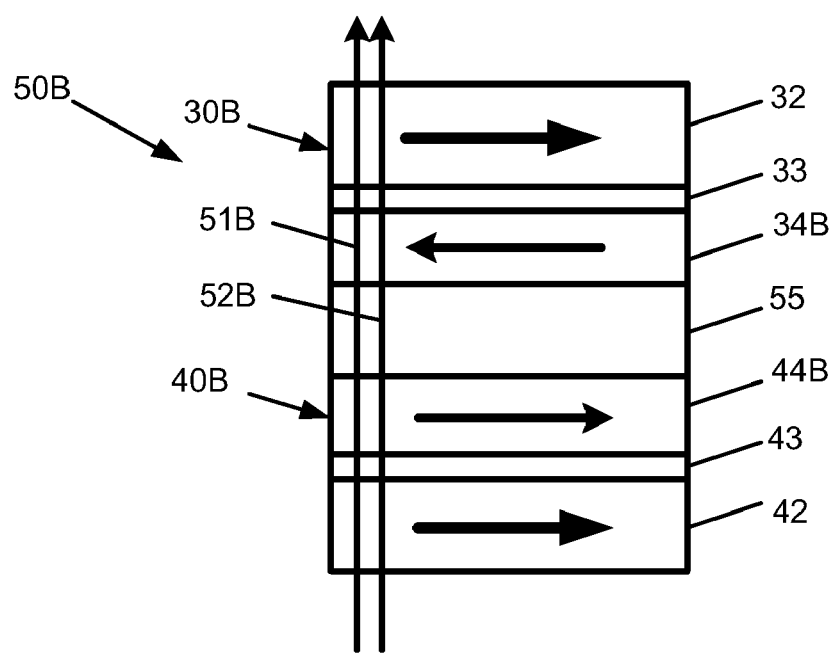
FIG. 4 is a schematic diagram of a fourth embodiment of a logic device according to the present disclosure, in particular, an XOR gate.

FIG. 4 illustrates device 50 programmed as device 50B, at the highest low resistance level (FIG. 2C). In use, two bits of data, as input current using the definitions of above, can be applied to device 50B. The input levels and output for the four possible configurations are summarized below in Table 4. These four configurations of inputs and output define logic device 50B as an XOR gate.

TABLE 4

| Input Data 51B | Input Data 52B | Free Layers | Output Data |
| --- | --- | --- | --- |
| 0 | 0 | No switch | 0 |
| 0 | 1 | Switch soft layer 44B | 1 |
| 1 | 0 | Switch soft layer 44B | 1 |
| 1 | 1 | Switch soft layer 44B and hard layer 34B | 0 |

When both inputs are "0", no free layers switch their magnetization orientation, and device 50B remains as it is. When the input is "01" or "10", sufficient input current is applied to switch soft layer 44B of element 40B, but not hard layer 34B. Because of the direction of current input through element 40B, first through pinned layer 42 and then through free layer 44A, the desired orientation is antiparallel. Thus, free layer 44B switches from its programmed magnetization orientation. When the input "11" is applied, sufficient input current is applied to switch hard free layer 34B of element 30B and soft free layer 44B of element 40B. Because the direction of current input into element 30B is first through free layer 34B then to pinned layer 32, free layer 34B desires parallel orientation, and hard free layer 34B switches. Similarly, because of the direction of current input through element 40B, the desired orientation is antiparallel, and soft free layer 44B switches from its programmed magnetization orientation.

Programmed device 50A of FIG. 3 and programmed device 50B of FIG. 4 also function as a controlled-NOT (CNOT) gate. When first input current 51A, 51B is "1" (on), the output will always be the opposite of the second input current 52A, 52B.

Devices 50A, 50B described above can be programmed and reprogrammed as described above in respect to devices 10A, 10B. These general devices 10, 50 have numerous advantages for enhancing integrated device density. For example, multiple functions can be performed by devices 10, 50; devices 10, 50 can function both as memory and a reconfigurable logic device. Also, by using spin torque switching of magnetization orientations, the processing time for devices 10, 50 is on the order of a nanosecond, providing fast response time. Further, due to the non-volatility of the magnetic devices, devices 10, 50 can retain information without extra needed power, which dramatically decreases power consumption.

Because each individual magnetic device (of above) can process information as a logic device and store information as a non-volatile memory unit, the multiple functions of the magnetic logic device (i.e., non-volatile memory and logic) can be incorporated into a single magnetic chip. For example, a system chip utilizing a magnetic logic device described above can have the computations structure and memory structure all in the same system chip. The traditional hard drive, memory, and CPU can be combined into a single, all-function-in-one system chip. Having such an all-function-in-one chip utilizing a plurality of magnetic logic devices reduces data communication time within a computing system, between the CPU, memory, and hard drive. Further, due to the non-volatility of the magnetic devices, a single, all-function-in-one magnetic chip can function and retain information using low power consumption.

Various configurations for magnetic logic elements and systems utilizing those elements have been discussed above. Thus, numerous embodiments of the RECONFIGURABLE MAGNETIC LOGIC DEVICE USING SPIN TORQUE are disclosed. The implementations described above and other implementations are within the scope of the following claims.

One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A reconfigurable device comprising:
   a first magnetic element comprising a ferromagnetic pinned layer, a ferromagnetic free layer, and a non-magnetic barrier layer therebetween, the free layer having a magnetization orientation switchable by spin torque;
   a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque;
   a first input current path and a second input current path into and through the first and second magnetic elements that provide a flow of electrons through the first magnetic element and the second magnetic element; and
   a resistance sensing circuit electrically connected to the first magnetic element and the second magnetic element, wherein the magnetic device is a NAND gate.

2. The magnetic device of claim 1, wherein the first free layer is antiparallel to the first pinned layer, and the second free layer is antiparallel to the second pinned layer, and the first pinned layer and second pinned layer are parallel.

3. A reconfigurable device comprising:
   a first magnetic element comprising a ferromagnetic pinned layer, a ferromagnetic free layer, and a non-magnetic barrier layer therebetween, the free layer having a magnetization orientation switchable by spin torque;
   a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque;
   a first input current path and a second input current path into and through the first and second magnetic elements that provide a flow of electrons through the first magnetic element and the second magnetic element; and
   a resistance sensing circuit electrically connected to the first magnetic element and the second magnetic element, wherein the magnetic device is an XOR gate.

4. The magnetic device of claim 3, wherein the first free layer is antiparallel to the first pinned layer, and the second free layer is parallel to the second pinned layer, and the first pinned layer and second pinned layer are parallel.

5. A reconfigurable device comprising:
   a first magnetic element comprising a ferromagnetic pinned layer, a ferromagnetic free layer, and a non-magnetic barrier layer therebetween, the free layer having a magnetization orientation switchable by spin torque;
   a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque, wherein the spacer layer is positioned between and adjacent the first free layer of the first magnetic element and the second free layer of the second magnetic element;
   a first input current path and a second input current path into and through the first and second magnetic elements that provide a flow of electrons through the first magnetic element and the second magnetic element; and
   a resistance sensing circuit electrically connected to the first magnetic element and the second magnetic element.

6. The magnetic device of claim 5, wherein the spacer layer comprises a non-magnetic material sufficiently thick to isolate the first magnetic element form the second magnetic element.

7. A reconfigurable device comprising:
   a first magnetic element comprising a ferromagnetic pinned layer, a ferromagnetic free layer, and a non-magnetic barrier layer therebetween, the free layer having a magnetization orientation switchable by spin torque;
   a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque, wherein the first free layer is a soft free layer and the second free layer is a hard free layer;
   a first input current path and a second input current path into and through the first and second magnetic elements that provide a flow of electrons through the first magnetic element and the second magnetic element; and
   a resistance sensing circuit electrically connected to the first magnetic element and the second magnetic element.

8. A reconfigurable device comprising:
   a first magnetic element comprising a ferromagnetic pinned layer, a ferromagnetic free layer, and a non-magnetic barrier layer therebetween, the free layer having a magnetization orientation switchable by spin torque;
   a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque, wherein the free layer of the first magnetic element and the free layer of the second magnetic element have different coercive fields;
   a first input current path and a second input current path into and through the first and second magnetic elements that provide a flow of electrons through the first magnetic element and the second magnetic element; and
   a resistance sensing circuit electrically connected to the first magnetic element and the second magnetic element.

9. A reconfigurable device comprising:
   a first magnetic element comprising a ferromagnetic pinned layer, a ferromagnetic free layer, and a non-magnetic barrier layer therebetween, the free layer having a magnetization orientation switchable by spin torque;
   a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque;

a first input current path and a second input current path into and through the first and second magnetic elements that provide a flow of electrons through the first magnetic element and the second magnetic element;

a resistance sensing circuit electrically connected to the first magnetic element and the second magnetic element; and an input system.

10. The magnetic device of claim 9, wherein the input system is configured to generate the first input current and the second input current.

11. A reconfigurable device comprising:

a first magnetic element comprising a ferromagnetic pinned layer, a ferromagnetic free layer, and a non-magnetic barrier layer therebetween, the free layer having a magnetization orientation switchable by spin torque;

a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque;

a first input current path and a second input current path into and through the first and second magnetic elements that provide a flow of electrons through the first magnetic element and the second magnetic element;

a resistance sensing circuit electrically connected to the first magnetic element and the second magnetic element; and an output sensing system.

12. A magnetic chip comprising a reconfigurable device the reconfigurable device comprising:

a first magnetic element comprising a ferromagnetic pinned layer, a ferromagnetic free layer, and a non-magnetic barrier layer therebetween, the free layer having a magnetization orientation switchable by spin torque;

a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque;

a first input current path and a second input current path into and through the first and second magnetic elements that provide a flow of electrons through the first magnetic element and the second magnetic element; and a resistance sensing circuit electrically connected to the first magnetic element and the second magnetic element, the chip configured to process information as a logic device and to store information as a non-volatile memory unit.

13. The chip of claim 12 further comprising a plurality of reconfigurable devices.

14. A method of programming a magnetic device, the method comprising:

providing a magnetic device comprising:

a first magnetic element comprising a ferromagnetic pinned layer, a ferromagnetic free layer, and a non-magnetic barrier layer therebetween, the free layer having a magnetization orientation switchable by spin torque;

a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque;

a first input current path and a second input current path into and through the first and second magnetic elements that provide a flow of electrons through the first magnetic element and the second magnetic element; and a resistance sensing circuit electrically connected to the first magnetic element and the second magnetic element;

orienting the magnetization orientation of the free layers by passing a first input current and a second input current through the magnetic device to form a programmed device; and reading the output data with a current less than a critical current of the free layers and, based on the input currents, determining a logic function of the device.

15. The method of claim 14, wherein the output data has either a high resistance or a low resistance.

16. The method of claim 14, further comprising after reading the output data:

reorienting the magnetization orientation of the free layers by passing a third input current and a fourth input current through the magnetic device, to form a reprogrammed device.

17. A method of programming a magnetic device, the method comprising:

providing a magnetic device comprising:

a first magnetic element comprising a ferromagnetic pinned layer, a ferromagnetic free layer, and a non-magnetic barrier layer therebetween, the free layer having a magnetization orientation switchable by spin torque;

a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque;

a first input current path and a second input current path into and through the first and second magnetic elements that provide a flow of electrons through the first magnetic element and the second magnetic element; and a resistance sensing circuit electrically connected to the first magnetic element and the second magnetic element;

orienting the magnetization orientation of the free layers by passing a first input current and a second input current through the magnetic device so that the pinned layer and the free layer of the first magnetic logic element are antiparallel and the pinned layer and the free layer of the second magnetic element are antiparallel, forming a programmed device thereby; and reading the output data and, based on the input currents, determining a logic function of the device.

18. A method of programming a magnetic device, the method comprising:

providing a magnetic device comprising:

a first magnetic element comprising a ferromagnetic pinned layer, a ferromagnetic free layer, and a non-magnetic barrier layer therebetween, the free layer having a magnetization orientation switchable by spin torque;

a second magnetic element connected in series to the first magnetic element with a spacer layer therebetween, the second element comprising a second ferromagnetic pinned layer, a second ferromagnetic free layer, and a second non-magnetic barrier layer therebetween, the second free layer having a magnetization orientation switchable by spin torque;

a first input current path and a second input current path into and through the first and second magnetic elements that provide a flow of electrons through the first magnetic element and the second magnetic element; and a resistance sensing circuit electrically connected to the first magnetic element and the second magnetic element;

orienting the magnetization orientation of the free layers by passing a first input current and a second input current through the magnetic device so that the pinned layer and the free layer of the first magnetic element are antiparallel and the pinned layer and the free layer of the second magnetic element are parallel, forming a programmed device thereby; and reading the output data and, based on the input currents, determining a logic function of the device.

* * * * *